(12) United States Patent
Wang

(10) Patent No.: US 12,205,981 B2
(45) Date of Patent: Jan. 21, 2025

(54) CAPACITOR STRUCTURE AND FORMING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Changzhou Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 506 days.

(21) Appl. No.: 17/450,520

(22) Filed: Oct. 11, 2021

(65) Prior Publication Data

US 2022/0123104 A1    Apr. 21, 2022

(30) Foreign Application Priority Data

Oct. 15, 2020  (CN) .......................... 202011104674.8

(51) Int. Cl.
| | | |
|---|---|---|
| H01L 27/08 | (2006.01) | |
| H01L 21/02 | (2006.01) | |
| H01L 49/02 | (2006.01) | |

(52) U.S. Cl.
CPC ........ H01L 28/75 (2013.01); H01L 21/02194 (2013.01); H01L 21/0228 (2013.01); H01L 27/0805 (2013.01); H01L 28/65 (2013.01)

(58) Field of Classification Search
CPC ........... H01L 21/02194; H01L 21/0228; H01L 28/75; H01L 28/65
See application file for complete search history.

(56) References Cited

U.S. PATENT DOCUMENTS

| | | | |
|---|---|---|---|
| 5,576,579 A | 11/1996 | Agnello et al. | |
| 2002/0074584 A1* | 6/2002 | Yang | H10B 12/033 257/E21.59 |
| 2005/0062130 A1* | 3/2005 | Ciancio | H01L 28/75 257/532 |
| 2007/0145525 A1* | 6/2007 | Wang | H01L 28/75 257/532 |

* cited by examiner

*Primary Examiner* — Christine A Enad
(74) *Attorney, Agent, or Firm* — Anova Law Group, PLLC

(57) ABSTRACT

A capacitor structure and a forming method thereof are provided. The capacitor structure includes a substrate and a bottom electrode composite layer on the substrate. The bottom electrode composite layer includes a first electrode layer and a second electrode layer on the first electrode layer. An oxidation rate of a material of the second electrode layer is lower than an oxidation rate of a material of the first electrode layer. The capacitor structure also includes a dielectric structure layer on the bottom electrode composite layer.

17 Claims, 4 Drawing Sheets

CAPACITOR STRUCTURE AND FORMING METHOD THEREOF

CROSS-REFERENCE TO RELATED APPLICATION

This application claims priority of Chinese Patent Application No. 202011104674.8, filed on Oct. 15, 2020, the entire content of which is hereby incorporated by reference.

FIELD OF THE DISCLOSURE

The present disclosure generally relates to the field of semiconductor manufacturing and, more particularly, relates to a capacitor structure and a forming method thereof.

BACKGROUND

In the field of semiconductor integrated circuit manufacturing technology, with development of semiconductor technology, performance requirements for semiconductor devices are getting higher and higher. Capacitors are important components of integrated circuits, and are widely used in chips, such as memories, microwave devices, radio-frequency devices, smart cards, high-voltage devices, and filtering devices. Specific applications of capacitors include bandpass filters, phase-locked loops, dynamic random-access memories, and so on. With development of semiconductor technology, capacitors in integrated circuits are expected to have characteristics of high capacitance density, low leakage, and small voltage linearity. These characteristics have become challenges for production of capacitors in integrated circuits.

Integrated circuit chips may include a plurality of types of capacitor structures, such as MOS field effect transistor capacitors, poly-insulator-poly (PIP) capacitors, variable junction capacitors, and metal-insulator-metal (MIM) capacitors and metal-oxide-metal (MOM) capacitors in back-end interconnects. Capacitor structures in back-end interconnects may not occupy areas of device layers, and may have linear characteristics better than linear characteristics of other types of capacitors.

However, performance of existing back-end capacitor structures such as MIM capacitors and MOM capacitors may still need to be improved. The disclosed structures and methods are directed to solve one or more problems set forth above and other problems in the art.

BRIEF SUMMARY OF THE DISCLOSURE

One aspect of the present disclosure includes a capacitor structure. The capacitor structure includes a substrate and a bottom electrode composite layer on the substrate. The bottom electrode composite layer includes a first electrode layer and a second electrode layer on the first electrode layer, and an oxidation rate of a material of the second electrode layer is lower than an oxidation rate of a material of the first electrode layer. The capacitor structure also includes a dielectric structure layer on the bottom electrode composite layer.

Optionally, conductivity of the material of the first electrode layer is greater than conductivity of the material of the second electrode layer.

Optionally, the first electrode layer is made of a material including metal or metal nitride. Atomic percentage concentration of a metal element of the material of the first electrode layer is greater than atomic percentage concentration of a metal element of the material of the second electrode layer. The metal includes titanium, tantalum, copper, tungsten, cobalt, aluminum, nickel, platinum, or a combination thereof. The metal nitride includes titanium nitride, tantalum nitride, copper nitride, tungsten nitride, platinum nitride, aluminum nitride, nickel nitride, cobalt nitride, or a combination thereof.

Optionally, an atomic ratio of metal atoms to nitrogen atoms of the metal nitride is greater than approximately 0.95.

Optionally, the second electrode layer is made of a material including metal nitride. Atomic percentage concentration of nitrogen element in the material of the second electrode layer is greater than atomic percentage concentration of nitrogen element in the material of the first electrode layer. The metal nitride includes titanium nitride, tantalum nitride, copper nitride, tungsten nitride, platinum nitride, aluminum nitride, nickel nitride, cobalt nitride, or a combination thereof.

Optionally, an atomic ratio of metal atoms to nitrogen atoms of the metal nitride is in a range approximately from 0.75 to 0.95.

Optionally, the dielectric structure layer includes a plurality of dielectric layers. The plurality of dielectric layers includes one layer, two layers, or three layers.

Optionally, a dielectric layer of the plurality of dielectric layers is made of a material including a dielectric material. The dielectric material includes zirconium oxide, tantalum oxide, aluminum oxide, hafnium oxide, lanthanum oxide, titanium oxide, silicon oxide, or a combination thereof.

Optionally, the first electrode layer has a thickness in a range approximately from 250 angstroms to 350 angstroms. The second electrode layer has a thickness in a range approximately from 20 angstroms to 100 angstroms.

Optionally, the dielectric structure layer has a thickness in a range approximately from 20 angstroms to 100 angstroms.

Optionally, the capacitor structure also includes a top electrode layer on the dielectric structure layer.

Optionally, the top electrode layer has a thickness in a range approximately from 500 angstroms to 700 angstroms.

Optionally, the top electrode layer is made of a material including titanium nitride.

Optionally, the substrate includes a base and a device layer on the base. The device layer includes an isolation structure and a device structure in the isolation structure. The device structure includes transistors, diodes, triodes, capacitors, inductors, conductive structures, or other devices. The bottom electrode composite layer is electrically connected to the device structure.

Another aspect of the present disclosure includes a method of forming a capacitor structure. The method includes providing a substrate and forming a bottom electrode composite layer on the substrate. The bottom electrode composite layer includes a first electrode layer and a second electrode layer on the first electrode layer, and an oxidation rate of a material of the second electrode layer is lower than an oxidation rate of a material of the first electrode layer. The method also includes forming a dielectric structure layer on the bottom electrode composite layer.

Optionally, conductivity of the material of the first electrode layer is greater than conductivity of the material of the second electrode layer.

Optionally, the first electrode layer is made of a material including metal or metal nitride. Atomic percentage concentration of a metal element of the material of the first electrode layer is greater than atomic percentage concentration of a metal element of the material of the second electrode layer. The metal includes combination of titanium, tantalum, copper, tungsten, cobalt, aluminum, nickel, platinum, or a combination thereof. The metal nitride includes titanium nitride, tantalum nitride, copper nitride, tungsten nitride, platinum nitride, aluminum nitride, nickel nitride, cobalt nitride, or a combination thereof.

Optionally, an atomic ratio of metal atoms to nitrogen atoms of the metal nitride is greater than approximately 0.95.

Optionally, a process of forming the first electrode layer includes an ion reactive sputtering process. A sputtering target includes a metal target. Reactive gas includes mixed gas of argon and nitrogen. A volume ratio of the argon to the nitrogen is not less than approximately 0.85.

Optionally, a process of forming the second electrode layer includes forming an initial second electrode layer on the first electrode layer, and planarizing the initial second electrode layer, thereby forming the second electrode layer.

Optionally, the initial second electrode layer is made of a material including metal nitride. Atomic percentage concentration of nitrogen element in a material of the initial second electrode layer is greater than atomic percentage concentration of nitrogen element in the material of the first electrode layer. The metal nitride includes titanium nitride, tantalum nitride, copper nitride, tungsten nitride, platinum nitride, aluminum nitride, nickel nitride, cobalt nitride, or a combination thereof.

Optionally, an atomic ratio of metal atoms to nitrogen atoms of the metal nitride is in a range approximately from 0.75 to 0.95.

Optionally, a process of forming the initial second electrode layer includes an ion reactive sputtering process. A sputtering target includes a metal target. Reactive gas includes nitrogen. Cavity pressure is greater than approximately 160 mtorr.

Optionally, a process of planarizing the initial second electrode layer includes a chemical mechanical polishing process.

Optionally, the initial second electrode layer has a thickness in a range approximately from 50 angstroms to 250 angstroms.

Optionally, the dielectric structure layer includes a plurality of dielectric layers. The plurality of dielectric layers includes one layer, two layers, or three layers.

Optionally, a dielectric layer of the plurality of dielectric layers is made of a material including a dielectric material. The dielectric material includes zirconium oxide, tantalum oxide, aluminum oxide, hafnium oxide, lanthanum oxide, titanium oxide, silicon oxide, or a combination thereof.

Optionally, a process of forming the dielectric layer includes a chemical vapor deposition process, a low-pressure chemical vapor deposition process, an ion-enhanced chemical vapor deposition process, or an atomic layer deposition process.

Optionally, the method, after forming the dielectric structure layer, also includes forming a top electrode layer on the dielectric structure layer.

Optionally, the method, after forming the top electrode layer, also includes etching the top electrode layer, the dielectric structure layer, and the bottom electrode composite layer until a surface of the isolation structure is exposed, thereby forming a bottom electrode composite structure, a dielectric structure on the bottom electrode composite structure, and a top electrode structure on the dielectric structure.

Optionally, the method, after forming the dielectric structure layer, before forming the top electrode layer on the dielectric structure layer, also includes annealing the dielectric structure layer and the bottom electrode composite layer. Annealing temperature is in a range approximately from 300 degrees Celsius to 450 degrees Celsius. Annealing time is in a range approximately from 60 seconds to 600 seconds. Cavity gas includes inert gas or ammonia gas.

Optionally, the top electrode layer has a thickness in a range approximately from 500 angstroms to 700 angstroms.

Optionally, the top electrode layer is made of a material including titanium nitride.

Optionally, the first electrode layer has a thickness in a range approximately from 250 angstroms to 350 angstroms. The second electrode layer has a thickness in a range approximately from 20 angstroms to 100 angstroms.

Optionally, the dielectric structure layer has a thickness in a range approximately from 20 angstroms to 100 angstroms.

Optionally, the substrate includes a base and a device layer on the base. The device layer includes an isolation structure and a device structure in the isolation structure. The device structure includes transistors, diodes, triodes, capacitors, inductors, conductive structures, or other devices. The bottom electrode composite layer is electrically connected to the device structure.

As disclosed, the technical solutions of the present disclosure have the following advantages.

The capacitor structure provided by the present disclosure includes a bottom electrode composite layer on the substrate. The bottom electrode composite layer includes a first electrode layer and a second electrode layer on the first electrode layer. An oxidation rate of a material of the second electrode layer is lower than an oxidation rate of a material of the first electrode layer. Accordingly, the oxidation degree of the bottom electrode composite layer during a subsequent formation process of the dielectric structure layer may be minimized without reducing the conductivity of the bottom electrode composite layer. As such, influence of oxidation of the bottom electrode composite layer on capacitance stability of the capacitor structure may be reduced, and thus performance of the capacitor structure may be improved.

Further, the conductivity of the material of the first electrode layer is greater than the conductivity of the material of the second electrode layer. Accordingly, the oxidation degree of the bottom electrode composite layer during a subsequent formation process of the dielectric structure layer may be minimized without reducing the conductivity of the bottom electrode composite layer.

Further, the first electrode layer is made of a material including metal or metal nitride. The metal content of the material of the first electrode layer is greater than the metal content of the material of the second electrode layer. An atomic ratio of metal atoms to nitrogen atoms of the metal nitride may be greater than approximately 0.95, and thus the conductivity of the first electrode layer may be higher than the conductivity of the second electrode layer.

Further, the second electrode layer is made of a material including metal nitride. Nitrogen content of the material of the second electrode layer is greater than nitrogen content of the material of the first electrode layer. An atomic ratio of metal atoms to nitrogen atoms of the metal nitride is in a range approximately from 0.75 to 0.95, and thus the second electrode layer formed may have better oxidation resistance than the first electrode layer.

In the method of forming a capacitor structure provided by the present disclosure, a bottom electrode composite layer may be formed on the substrate. The bottom electrode composite layer includes a first electrode layer and a second electrode layer on the first electrode layer. An oxidation rate of a material of the second electrode layer is lower than an oxidation rate of a material of the first electrode layer. Accordingly, by forming the bottom electrode composite layer, the oxidation degree of the bottom electrode composite layer during a subsequent formation process of the dielectric structure layer may be minimized without reducing the conductivity of the bottom electrode composite layer. As such, influence of oxidation of the bottom electrode composite layer on the capacitance stability of the capacitor structure may be reduced, and thus performance of the capacitor structure may be improved.

Further, the conductivity of the material of the first electrode layer is greater than the conductivity of the material of the second electrode layer. Accordingly, the oxidation degree of the bottom electrode composite layer during a subsequent formation process of the dielectric structure layer may be minimized without reducing the conductivity of the bottom electrode composite layer.

Further, the first electrode layer is made of a material including metal or metal nitride. The metal content of the material of the first electrode layer is greater than the metal content of the material of the second electrode layer. An atomic ratio of metal atoms to nitrogen atoms of the metal nitride may be greater than approximately 0.95, and thus the conductivity of the first electrode layer may be higher than the conductivity of the second electrode layer.

Further, the second electrode layer is made of a material including metal nitride. Nitrogen content of the material of the second electrode layer is greater than nitrogen content of the material of the first electrode layer. An atomic ratio of metal atoms to nitrogen atoms of the metal nitride is in a range approximately from 0.75 to 0.95, and thus the second electrode layer formed may have better oxidation resistance than the first electrode layer.

Further, after the initial second electrode layer is formed, the initial second electrode layer is planarized, thereby forming the second electrode layer. On one hand, the second electrode layer may be controlled within a preset range. When the second electrode layer is too thick (greater than the preset range), the conductivity of the bottom electrode composite layer may be reduced. When the second electrode layer is too thin (less than the present range), oxygen in the dielectric structure may penetrate the second electrode layer to oxidize the first electrode layer. On the other hand, by planarizing the initial second electrode layer, a surface of the second electrode layer may be smooth, and the dielectric structure layer subsequently formed on the second electrode layer may have a good covering effect. When surface roughness of the bottom electrode composite layer is large, a contact effect between the dielectric structure layer and the bottom electrode composite layer may be bad, and reliability of the capacitor structure may be decreased

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

It should be noted that, in the present disclosure, the terms "surface" and "upper" are used to describe relative positional relationships in space, and are not limited to as direct contact.

Performance of existing back-end capacitor structures such as metal-insulator-metal (MIM) capacitors and metal-oxide-metal (MOM) capacitors may need to be improved.

Figure 1:
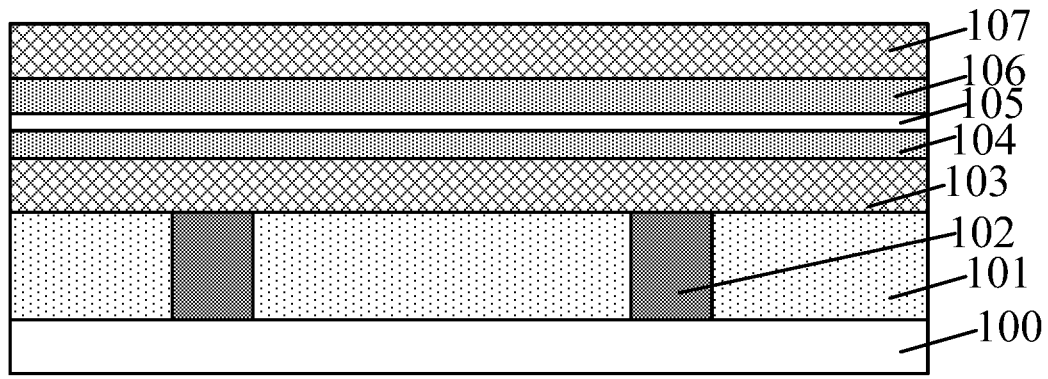
FIG. 1 illustrates a cross-sectional structural diagram of a capacitor structure consistent with the disclosed embodiments of the present disclosure.

FIG. 1 illustrates a cross-sectional structural diagram of a capacitor structure. Referring to FIG. 1, the capacitor structure includes a substrate. The substrate includes a base 100 and a device layer located on the base 100. The device layer includes an isolation structure 101 and a device structure 102 located in the isolation structure 101. The device structure may include transistors, diodes, triodes, capacitors, inductors, or conductive structures, etc. The capacitor structure also includes a bottom electrode layer 103 on the substrate, and a dielectric structure layer located on the bottom electrode layer 103. The dielectric structure layer may include a first dielectric layer 104, a second dielectric layer 105 located on the first dielectric layer 104, and a third dielectric layer 106 located on the second dielectric layer 105. The capacitor structure also includes a top electrode layer 107 on the dielectric structure layer.

In the capacitor structure, the bottom electrode layer 103, the dielectric structure layer, and the top electrode layer 107 constitute an MIM capacitor structure. To obtain a higher capacitance density, in the dielectric structure layer, the first dielectric layer 104 is usually made of zirconia, the second dielectric layer 105 is usually made of alumina, and the third dielectric layer 106 is usually made of zirconia. The first dielectric layer 104 is usually formed by an atomic layer deposition process. To obtain zirconia with high film quality, ozone is often used as an oxygen source in gas, such that the zirconia formed may be sufficiently oxidized and may have a high density.

However, ozone may also oxidize the bottom electrode layer 103. Accordingly, an alloy phase containing an oxide of a material of the bottom electrode layer 103 may be formed at an interface between the bottom electrode layer 103 and the first dielectric layer 104. On one hand, the alloy phase may make the capacitance of the capacitor structure formed by the bottom electrode layer 103, the dielectric structure layer, and the top electrode layer 107 inconsistent during a charging and discharging process. As such, the capacitance of the capacitor structure during the charging and discharging process may exhibit non-linear relationships, making voltage of the capacitor structure uncontrollable. On the other hand, the alloy phase may reduce density of the capacitor structure and increases leakage risk of the capacitor structure.

The present disclosure provides a capacitor structure and a forming method of the capacitor structure. The capacitor structure includes a substrate and a bottom electrode composite layer on the substrate. The bottom electrode composite layer includes a first electrode layer and a second electrode layer located on the first electrode layer. An oxidation rate of a material of the second electrode layer is lower than an oxidation rate of a material of the first electrode layer. The capacitor structure also includes a dielectric structure layer on the bottom electrode composite layer. Performance of the capacitor structure may thus be improved.

As disclosed, the bottom electrode composite layer includes the first electrode layer and the second electrode layer located on the first electrode layer. The oxidation rate of the material of the second electrode layer is lower than the oxidation rate of the material of the first electrode layer. Accordingly, oxidation degree of the bottom electrode composite layer may be minimized during a subsequent formation process of the dielectric structure layer without reducing conductivity of the bottom electrode composite layer. As such, influence of oxidation of the bottom electrode composite layer on the capacitance stability of the capacitor structure may be reduced, and performance of the capacitor structure may thus be improved.

Figure 6:
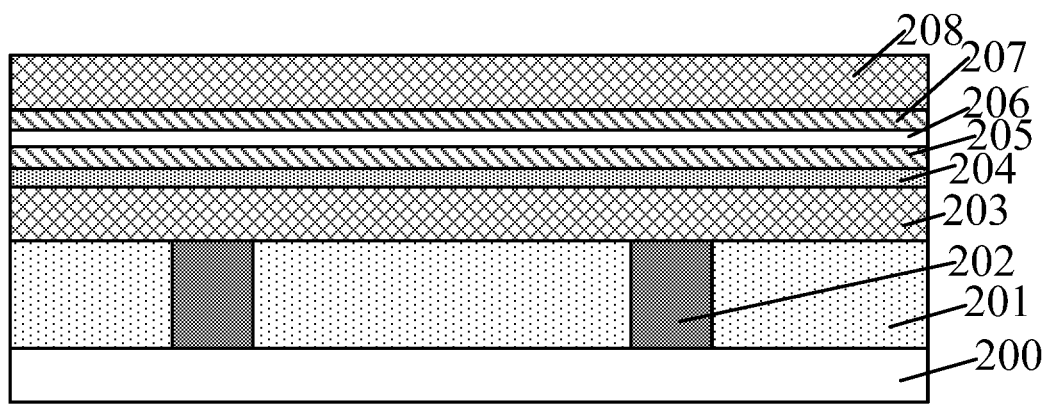
Figure 7:
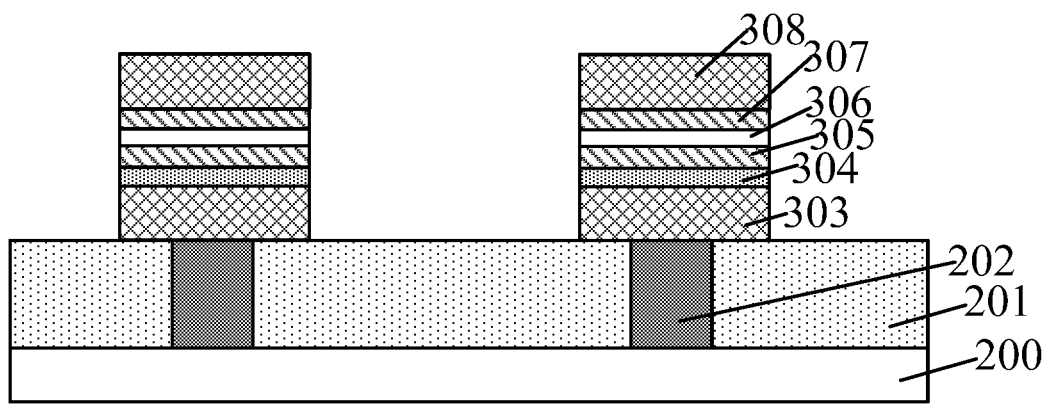
Figure 8:
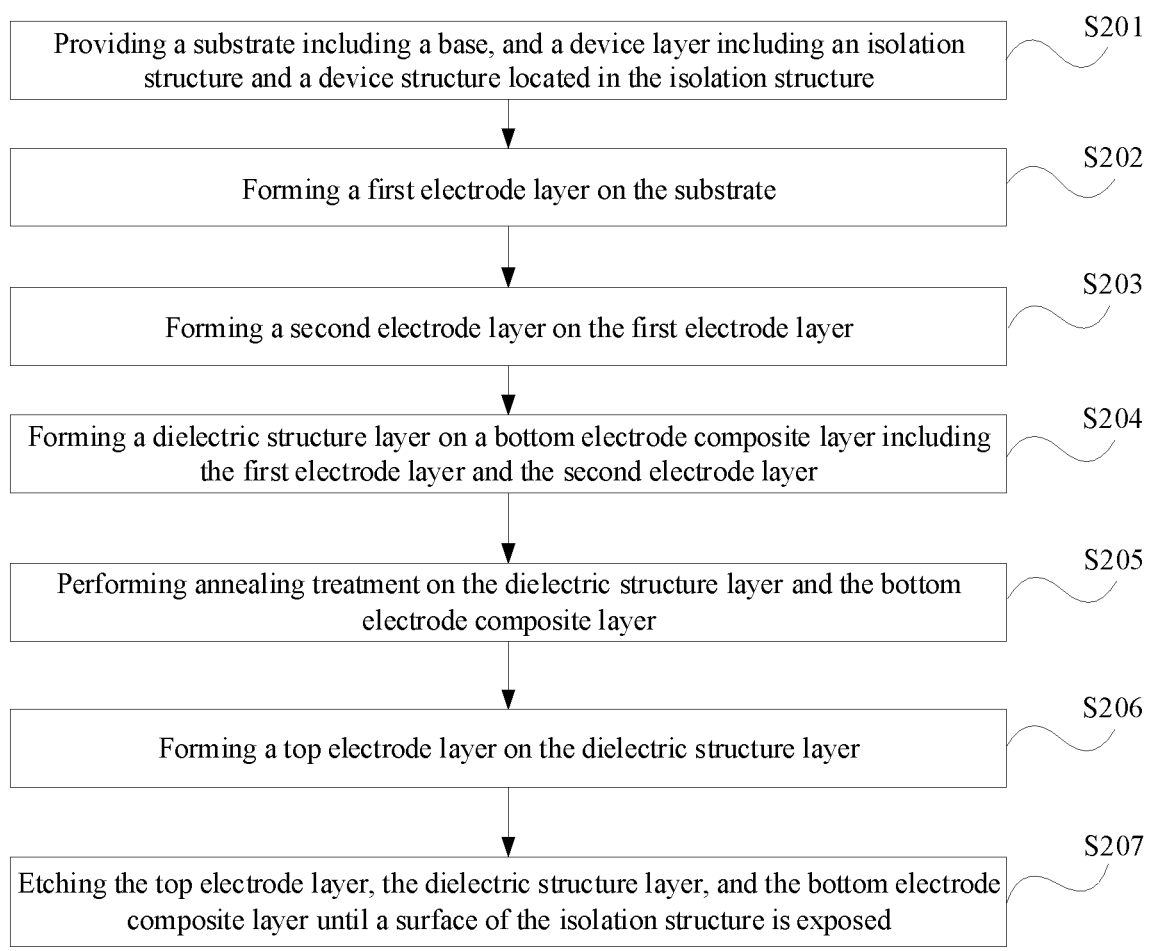
FIG. 8 illustrates a flowchart of an exemplary forming process of a capacitor structure, consistent with the disclosed embodiments of the present disclosure.

FIG. 8 illustrates a flowchart of an exemplary forming process of a capacitor structure, consistent with the disclosed embodiments of the present disclosure. FIGS. 2 to 7 illustrate cross-sectional structural diagrams corresponding to certain stages of the exemplary forming process of the capacitor structure.

Figure 2:
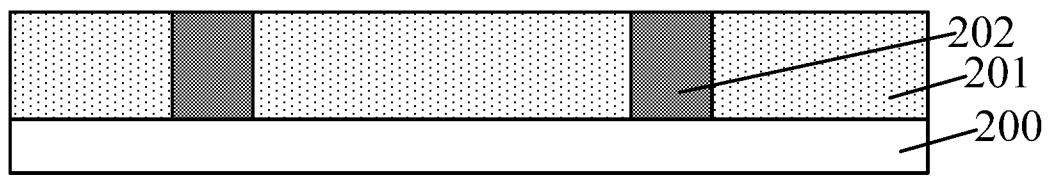
FIGS. 2 to 7 illustrate cross-sectional structural diagrams corresponding to certain stages of an exemplary forming process of a capacitor structure, consistent with the disclosed embodiments of the present disclosure.

As shown in FIG. 8, at the beginning of the forming process, a substrate is provided (S201). FIG. 2 illustrates a corresponding semiconductor structure.

Referring to FIG. 2, a substrate is provided. The substrate includes a base 200 and a device layer on the base 200. The device layer includes an isolation structure 201 and a device structure 202 located in the isolation structure. The device structure 202 may include transistors, diodes, triodes, capacitors, inductors, or conductive structures.

In one embodiment, the base 200 is made of silicon. In some other embodiments, the base 200 may be made of a material including silicon carbide, silicon germanium, multi-element semiconductor materials composed of group III-V elements, silicon on insulator (SOI), or germanium on insulator (GOI). The multi-element semiconductor materials composed of group III-V elements may include InP, GaAs, GaP, InAs, InSb, InGaAs, or InGaAsP.

The isolation structure 201 is made of a material including a dielectric material. The dielectric material may include silicon oxide, silicon nitride, silicon carbide, silicon oxycarbide, silicon oxynitride, aluminum oxide, aluminum nitride, silicon carbide nitride, silicon carbide oxynitride, or a combination thereof. In one embodiment, the isolation structure 201 is made of a material including silicon oxide.

A bottom electrode composite layer may then be formed on the substrate. The bottom electrode composite layer is electrically connected to the device structure 202. The bottom electrode composite layer includes a first electrode layer 203 and a second electrode layer 204 located on the first electrode layer 203. An oxidation rate of a material of the second electrode layer 204 is lower than an oxidation rate of a material of the first electrode layer 203. For a formation process of the bottom electrode composite layer, reference may be made to FIG. 3 and FIG. 4.

Figure 3:
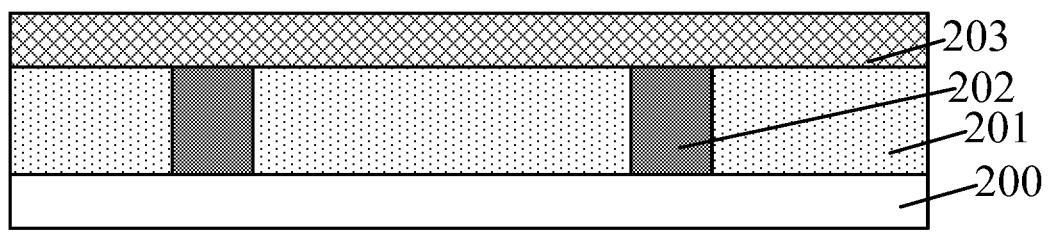

Returning to FIG. 8, after providing the substrate, a first electrode layer may be formed on the substrate (S202). FIG. 3 illustrates a corresponding semiconductor structure.

Referring to FIG. 3, a first electrode layer 203 is formed on the substrate. The first electrode layer 203 is electrically connected to the device structure 202.

The first electrode layer 203 is made of a material including metal or metal nitride. An atomic percentage concentration of a metal element of the material of the first electrode layer 203 is greater than an atomic percentage concentration of a metal element of the material of the second electrode layer formed subsequently. The metal may include titanium, tantalum, copper, tungsten, cobalt, aluminum, nickel, platinum, or a combination thereof. The metal nitride may include titanium nitride, tantalum nitride, copper nitride, tungsten nitride, platinum nitride, aluminum nitride, nickel nitride, cobalt nitride, or a combination thereof.

In one embodiment, an atomic ratio of metal atoms to nitrogen atoms of the metal nitride is greater than approximately 0.95. Accordingly, content of metal element of the first electrode layer 203 may be relatively high, and thus conductivity of the first electrode layer 203 may be relatively high. As such, conductive effects of the bottom electrode composite layer may be improved.

A process of forming the first electrode layer 203 includes an atomic layer deposition process, an ion reactive sputtering process, a chemical vapor deposition process, a physical vapor deposition process, or an electroplating process.

In one embodiment, the process of forming the first electrode layer 203 includes an ion reactive sputtering process. The ion reactive sputtering process include following parameters. A sputtering target includes a metal target. Reactive gas includes mixed gas of argon and nitrogen, and a volume ratio of the argon to nitrogen is not less than approximately 0.85.

In one embodiment, the first electrode layer has a thickness in a range approximately from 250 angstroms to 350 angstroms. When the thickness of the first electrode layer is too thin (less than approximately 250 angstroms), the conductivity of the bottom electrode composite layer formed may be insufficient. When the thickness of the first electrode layer is too thick (greater than approximately 250 angstroms), requirements for thickness accuracy of the second electrode layer and the dielectric structure composite layer to be formed later may be higher, and the process window may be smaller.

Figure 4:
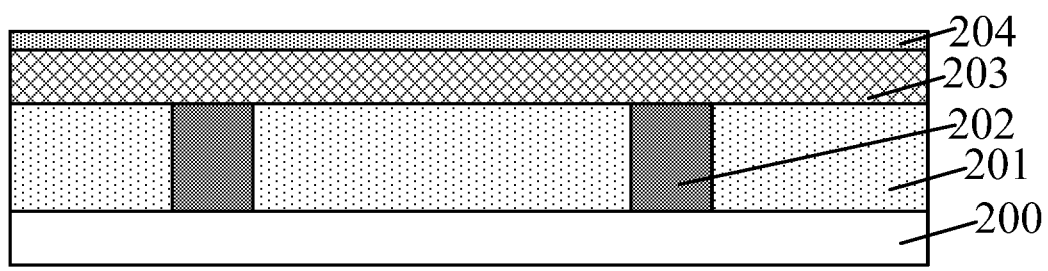

Returning to FIG. 8, after forming the first electrode layer, a second electrode layer may be formed on the first electrode layer (S203). FIG. 4 illustrates a corresponding semiconductor structure.

Referring to FIG. 4, a second electrode layer 204 is formed on the first electrode layer 203. A process of forming the second electrode layer 204 includes forming an initial second electrode layer (not shown) on the first electrode layer 203, and planarizing the initial second electrode layer to form the second electrode layer 204.

The initial second electrode layer is made of a material including metal nitride. An atomic percentage concentration of nitrogen element in the material of the initial second electrode layer is greater than an atomic percentage concentration of nitrogen element in the material of the first electrode layer 203. The metal nitride may include titanium nitride, tantalum nitride, copper nitride, tungsten nitride, platinum nitride, aluminum nitride, nickel nitride, cobalt nitride, or a combination thereof.

In one embodiment, an atomic ratio of metal atoms to nitrogen atoms of the metal nitride is in a range approximately from 0.75 to 0.95.

The metal element content of the first electrode layer 203 is relatively high, and a nitrogen element content of the initial second electrode layer is relatively high. Accordingly, conductivity of the material of the first electrode layer 203 may be greater than conductivity of the material of the second electrode layer 204. An oxidation rate of the material of the second electrode layer 204 may be less than an oxidation rate of the material of the first electrode layer 203. As such, the second electrode layer 204 formed may not be easily oxidized. Accordingly, the oxidation degree of the bottom electrode composite layer may be minimized during a subsequent formation process of the dielectric structure layer without reducing the conductivity of the bottom electrode composite layer. As a result, influence of oxidation of the bottom electrode composite layer on the capacitance stability of the capacitor structure may be reduced, and thus performance of the capacitor structure may be improved.

A process of forming the initial second electrode layer includes an atomic layer deposition process, an ion reactive sputtering process, a chemical vapor deposition process, a physical vapor deposition process, or an electroplating process.

In one embodiment, the process of forming the initial second electrode layer includes an ion reactive sputtering process. The ion reactive sputtering process includes following parameters. A sputtering target includes a metal target, reactive gas includes nitrogen, and cavity pressure is greater than approximately 160 mtorr.

In one embodiment, a planarization process of the initial second electrode layer includes a chemical mechanical polishing process. On one hand, the planarization process may control the second electrode layer 204 to be within a preset range. When the second electrode layer 204 is too thick (greater than the preset range), the conductivity of the bottom electrode composite layer may be reduced. When the second electrode layer 204 is too thin (less than the present range), oxygen in the dielectric structure may penetrate the second electrode layer 204 to oxidize the first electrode layer 203. On the other hand, by planarizing the initial second electrode layer with the chemical mechanical polishing process, a surface of the second electrode layer 204 may be smooth, and the dielectric structure layer subsequently formed on the second electrode layer 204 may have a good covering effect. When surface roughness of the bottom electrode composite layer is large, a contact effect between the dielectric structure layer and the bottom electrode composite layer may be bad, and reliability of the capacitor structure may be decreased.

In some other embodiments, the initial second electrode layer may not be planarized.

In one embodiment, the initial second electrode layer has a thickness in a range approximately from 50 angstroms to 250 angstroms. The second electrode layer 204 formed by planarizing the initial second electrode layer has a thickness in a range approximately from 20 angstroms to 100 angstroms. When the thickness of the second electrode layer 204 is thicker, the resistance of the bottom electrode composite layer formed may be higher and the conductivity may be lower. When the thickness of the second electrode layer 204 is thinner, when the dielectric structure layer is subsequently formed, the second electrode layer 204 may have weaker oxidation resistance, and the first electrode layer may be oxidized during a formation process of the dielectric structure layer. Accordingly, the conductivity of the bottom electrode composite layer may be affected, and thus consistency of the capacitor structure during the charging and discharging process may be affected.

Figure 5:
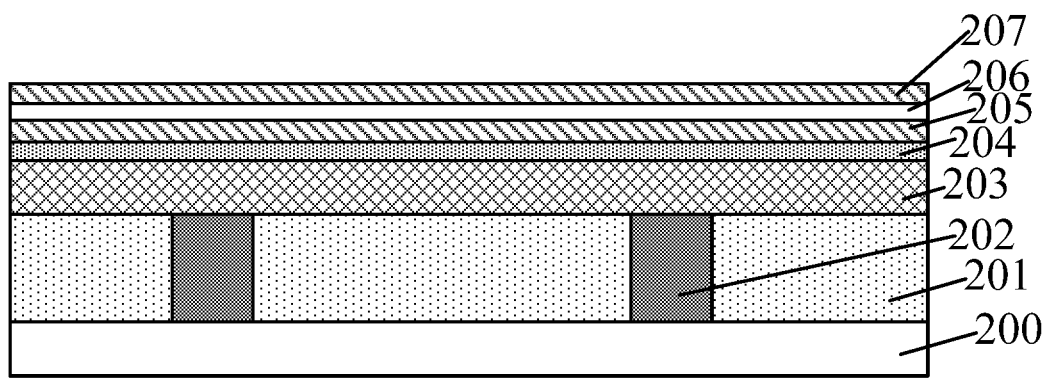

Returning to FIG. 8, after forming the second electrode layer, a dielectric structure layer may be formed on the bottom electrode composite layer (S204). FIG. 5 illustrates a corresponding semiconductor structure.

Referring to FIG. 5, a dielectric structure layer is formed on the bottom electrode composite layer. The dielectric structure layer includes a plurality of dielectric layers. The plurality of layers may include one layer, two layers, or three layers.

The dielectric layer is made of a material including a dielectric material. The dielectric material may include zirconium oxide, tantalum oxide, aluminum oxide, hafnium oxide, lanthanum oxide, titanium oxide, silicon oxide, or a combination thereof. The plurality of dielectric layers may be made of totally same material, totally different materials, or partially different materials.

The plurality of dielectric layers may be combined arbitrarily according to requirements of device performance, and dielectric constants of the materials of the dielectric layers are not limited in the present disclosure.

A process of forming the dielectric layer includes a chemical vapor deposition process, a low-pressure chemical vapor deposition process, an ion-enhanced chemical vapor deposition process, or an atomic layer deposition process.

The dielectric layer may be made of oxides, and thus the reaction gas in the process of forming the dielectric layer may contain oxygen. Since the nitrogen content of the second electrode layer 204 is higher, the oxidation resistance of the second electrode layer 204 may be better. Accordingly, the oxidation degree of the second electrode layer 204 and the first electrode layer during the formation of the dielectric structure layer may be minimized. As such, influence of the oxidation of the bottom electrode composite layer on capacitance stability of the capacitor structure may be reduced, and thus performance of the capacitor structure may be improved.

In one embodiment, the dielectric structure layer includes three dielectric layers. The dielectric structure layer includes a first dielectric layer 205, a second dielectric layer 206 on the first dielectric layer 205, and a third dielectric layer 207 on the second dielectric layer 206.

In one embodiment, the first dielectric layer 205 is made of a material including zirconia. The second dielectric layer 206 is made of a material including alumina. The third dielectric layer 207 is made of a material including zirconia. The materials of dielectric structure layers have high dielectric constants, and thicknesses of the dielectric structure layers may be made to be thin. Accordingly, the capacitance between the top electrode layer formed later and the bottom electrode composite layer may be increased, and the performance of the capacitor structure may be improved.

In one embodiment, the dielectric structure layer has a thickness in a range approximately from 20 angstroms to 100 angstroms. When the thickness of the dielectric structure layer is too thin, that is, less than approximately 20 angstroms, the dielectric structure layer may be easily broken down and leakage may occur. When the thickness of the dielectric structure layer is too thick, that is, greater than approximately 100 angstroms, the capacitance of the capacitor structure may be reduced, and performance of the capacitor structure may not be improved.

Returning to FIG. 8, after forming the dielectric structure layer, annealing treatment may be performed on the dielectric structure layer and the bottom electrode composite layer (S205). FIG. 6 illustrates a corresponding semiconductor structure.

Referring to FIG. 6, after the dielectric structure layer is formed, annealing treatment is performed on the dielectric structure layer and the bottom electrode composite layer. The annealing treatment may eliminate defects of the material of the bottom electrode composite layer. As a result, the material of the bottom electrode composite layer may have a denser structure, and a better conductive effect. Deformation of the bottom electrode composite layer in subsequent annealing process may be avoided. Accordingly, stability of the capacitor structure performance may be improved.

The annealing treatment include following parameters. Annealing temperature is in a range approximately from 300 degrees Celsius to 450 degrees Celsius. Annealing time is in a range approximately from 60 seconds to 600 seconds, and gas in the cavity may include inert gas or ammonia gas.

In some other embodiments, the annealing treatment may be performed in other steps.

Returning to FIG. 8, after performing the annealing treatment, a top electrode layer may be formed on the dielectric structure layer (S206). FIG. 6 illustrates a corresponding semiconductor structure.

With continuous reference to FIG. 6, after the dielectric structure layer is formed, a top electrode layer 208 is formed on the dielectric structure layer.

The top electrode layer 208 is made of a material including metal or metal nitride. The metal includes titanium, tantalum, copper, tungsten, cobalt, aluminum, nickel, platinum, or a combination thereof. The metal nitride includes titanium nitride, tantalum nitride, copper nitride, tungsten nitride, platinum nitride, aluminum nitride, nickel nitride, cobalt nitride, or a combination thereof. In one embodiment, the top electrode layer 208 is made of a material including titanium nitride.

A forming process of the top electrode layer 208 includes an atomic layer deposition process, an ion reactive sputtering process, a chemical vapor deposition process, a physical vapor deposition process, or an electroplating process. In one embodiment, the forming process of the top electrode layer 208 includes an atomic layer deposition process. The top electrode layer 208 formed by the atomic layer deposition process may have a dense structure.

In one embodiment, the top electrode layer 208 has a thickness in a range approximately from 500 angstroms to 700 angstroms. When the thickness of the top electrode layer 208 is too large (larger than approximately 700 angstroms), the top electrode layer 208 may occupy a dimensional space of the subsequent structure, and dimensional accuracy requirements of subsequent structure formation processes may thus be increased. When the thickness of the top electrode layer 208 is too small (less than approximately 500 angstroms), the conductive effect of the top electrode layer 208 may be weakened, and performance of the capacitor structure may be affected.

Returning to FIG. 8, after forming the top electrode layer, the top electrode layer, the dielectric structure layer, and the bottom electrode composite layer may be etched until a surface of the isolation structure is exposed (S207). FIG. 7 illustrates a corresponding semiconductor structure.

Referring to FIG. 7, after the top electrode layer 208 is formed, the top electrode layer 208, the dielectric structure layer, and the bottom electrode composite layer are etched until the surface of the isolation structure 202 is exposed. Accordingly, a bottom electrode composite structure, a dielectric structure on the bottom electrode composite struc-ture, and a top electrode structure 308 on the dielectric structure are formed. The bottom electrode composite structure includes a first electrode structure 303 and a second electrode structure 304 located on the first electrode structure 303. The dielectric structure includes a first layer 305, a second layer 306 on the first layer 305, and a third layer 307 on the second layer 306.

A process of etching the top electrode layer 208, the dielectric structure layer and the bottom electrode composite layer includes a dry etching process. The dry etching process has good direction selectivity, and a capacitor structure with good sidewall morphology may be formed, such that performance consistency of the capacitor structure may be improved.

The present disclosure also provides a semiconductor structure. Referring to FIG. 6, the semiconductor structure includes a substrate, a bottom electrode composite layer on the substrate, and a dielectric structure layer on the bottom electrode composite layer. The bottom electrode composite layer includes a first electrode layer 203 and a second electrode layer 204 located on the first electrode layer 203. An oxidation rate of a material of the second electrode layer 204 is lower than an oxidation rate of a material of the first electrode layer 203.

In one embodiment, conductivity of the material of the first electrode layer 203 is greater than conductivity of the material of the second electrode layer 204.

In one embodiment, the first electrode layer 203 is made of a material including metal or metal nitride. An atomic percentage concentration of a metal element of the material of the first electrode layer 203 is greater than an atomic percentage concentration of a metal element of the material of a second electrode layer formed subsequently. The metal includes titanium, tantalum, copper, tungsten, cobalt, aluminum, nickel, platinum, or a combination thereof. The metal nitride includes titanium nitride, tantalum nitride, copper nitride, tungsten nitride, platinum nitride, aluminum nitride, nickel nitride, cobalt nitride, or a combination thereof.

In one embodiment, an atomic ratio of metal atoms to nitrogen atoms of the metal nitride is greater than approximately 0.95.

In one embodiment, the second electrode layer 204 is made of a material including metal nitride. Atomic percentage concentration of nitrogen element in the material of the second electrode layer 204 is greater than atomic percentage concentration of nitrogen element in the material of the first electrode layer 203. The metal nitride includes titanium nitride, tantalum nitride, copper nitride, tungsten nitride, platinum nitride, aluminum nitride, nickel nitride, cobalt nitride, or a combination thereof.

In one embodiment, an atomic ratio of metal atoms to nitrogen atoms of the metal nitride is in a range approximately from 0.75 to 0.95.

In one embodiment, the dielectric structure layer includes a plurality of dielectric layers. The plurality of layers may include one layer, two layers, or three layers.

In one embodiment, the dielectric layer is made of a material including a dielectric material. The dielectric material includes zirconium oxide, tantalum oxide, aluminum oxide, hafnium oxide, lanthanum oxide, titanium oxide, silicon oxide, or a combination thereof.

In one embodiment, the first electrode layer 203 has a thickness in a range approximately from 250 angstroms to 350 angstroms. The second electrode layer 204 has a thickness in a range approximately from 20 angstroms to 100 angstroms.

In one embodiment, the dielectric structure layer has a thickness in a range approximately from 20 angstroms to 100 angstroms.

In one embodiment, the semiconductor structure further includes a top electrode layer 208 on the dielectric structure layer.

In one embodiment, the top electrode layer 208 has a thickness in a range approximately from 500 angstroms to 700 angstroms.

In one embodiment, the top electrode layer 208 is made of a material including titanium nitride.

In one embodiment, the substrate includes a base 200 and a device layer on the base 200. The device layer includes an isolation structure 201 and a device structure 202 located in the isolation structure. The device structure 202 may include transistors, diodes, triodes, capacitors, inductors, or conductive structures. The bottom electrode composite layer may be electrically connected to the device structure 202.

The capacitor structure includes a bottom electrode composite layer on the substrate. The bottom electrode composite layer includes a first electrode layer 203 and a second electrode layer 204 on the first electrode layer 203. An oxidation rate of a material of the second electrode layer 204 is lower than an oxidation rate of a material of the first electrode layer 203. Accordingly, the oxidation degree of the bottom electrode composite layer during a subsequent formation process of the dielectric structure layer may be minimized without reducing the conductivity of the bottom electrode composite layer. As such, influence of oxidation of the bottom electrode composite layer on the capacitance stability of the capacitor structure may be reduced, and thus performance of the capacitor structure may be improved.

Further, the conductivity of the material of the first electrode layer 203 may be greater than the conductivity of the material of the second electrode layer 204. Accordingly, the oxidation degree of the bottom electrode composite layer during a subsequent formation process of the dielectric structure layer may be minimized without reducing the conductivity of the bottom electrode composite layer.

Further, the first electrode layer 203 is made of a material including metal or metal nitride. The metal content of the material of the first electrode layer 203 is greater than the metal content of the material of the second electrode layer 204. An atomic ratio of metal atoms to nitrogen atoms of the metal nitride may be greater than approximately 0.95, and thus the conductivity of the first electrode layer 203 may be high.

Further, the second electrode layer 204 is made of a material including metal nitride. Nitrogen content of the material of the second electrode layer 204 is greater than nitrogen content of the material of the first electrode layer 203. An atomic ratio of metal atoms to nitrogen atoms of the metal nitride is in a range approximately from 0.75 to 0.95, and thus the second electrode layer 204 formed may have good oxidation resistance.

The embodiments disclosed in the present disclosure are exemplary only and not limiting the scope of the present disclosure. Various combinations, alternations, modifications, or equivalents to the technical solutions of the disclosed embodiments can be obvious to those skilled in the art and can be included in the present disclosure. Without departing from the spirit of the present disclosure, the technical solutions of the present disclosure may be implemented by other embodiments, and such other embodiments are intended to be encompassed within the scope of the present disclosure.

What is claimed is:

1. A capacitor structure, comprising:
a substrate;
a bottom electrode composite layer on a top surface of the substrate, wherein the bottom electrode composite layer includes a first electrode layer on the top surface of the substrate and a second electrode layer on a top surface of the first electrode layer, and an oxidation rate of a material of the second electrode layer is lower than an oxidation rate of a material of the first electrode layer, the material of the first electrode layer including metal nitride with a first atomic ratio of metal atoms to nitrogen atoms, the material of the second electrode layer including metal nitride with a second atomic ratio of metal atoms to nitrogen atoms, the first atomic ratio of the metal nitride included in the first electrode layer being greater than the second atomic ratio of the metal nitride included in the second electrode layer;
a dielectric structure layer on a top surface of the second electrode layer, the dielectric structure layer including:
a first dielectric layer on the top surface of the second electrode layer;
a second dielectric layer on a top surface of the first dielectric layer, a material of the second dielectric layer being different from a material of the first dielectric layer; and
a third dielectric layer on a top surface of the second dielectric layer, a material of the third dielectric layer being same as the material of the first dielectric layer; and
a top electrode layer on a top surface of the third dielectric layer.

2. The capacitor structure according to claim 1, wherein:
conductivity of the material of the first electrode layer is greater than conductivity of the material of the second electrode layer.

3. The capacitor structure according to claim 1, wherein:
the metal nitride included in the first electrode layer includes titanium nitride, tantalum nitride, copper nitride, tungsten nitride, platinum nitride, aluminum nitride, nickel nitride, cobalt nitride, or a combination thereof.

4. The capacitor structure according to claim 1, wherein:
the first atomic ratio of metal atoms to nitrogen atoms of the metal nitride is greater than approximately 0.95.

5. The capacitor structure according to claim 1, wherein:
the metal nitride included in the second electrode layer includes titanium nitride, tantalum nitride, copper nitride, tungsten nitride, platinum nitride, aluminum nitride, nickel nitride, cobalt nitride, or a combination thereof.

6. The capacitor structure according to claim 1, wherein:
the second atomic ratio of metal atoms to nitrogen atoms of the metal nitride is in a range approximately from 0.75 to 0.95.

7. The capacitor structure according to claim 1, wherein:
the first dielectric layer is made of the material including a dielectric material; and
the dielectric material includes zirconium oxide, tantalum oxide, aluminum oxide, hafnium oxide, lanthanum oxide, titanium oxide, silicon oxide, or a combination thereof.

8. The capacitor structure according to claim 1, wherein:
the first electrode layer has a thickness in a range approximately from 250 angstroms to 350 angstroms;
the second electrode layer has a thickness in a range approximately from 20 angstroms to 100 angstroms; and the dielectric structure layer has a thickness in a range approximately from 20 angstroms to 100 angstroms.

9. The capacitor structure according to claim 1, wherein:
the top electrode layer has a thickness in a range approximately from 500 angstroms to 700 angstroms; and
the top electrode layer is made of a material including titanium nitride.

10. The capacitor structure according to claim 1, wherein:
the substrate includes a base and a device layer on the base;
the device layer includes an isolation structure and a device structure in the isolation structure;
the device structure includes transistors, diodes, triodes, capacitors, inductors, conductive structures, or a combination thereof; and
the bottom electrode composite layer is electrically connected to the device structure.

11. A method of forming a capacitor structure, comprising:
providing a substrate;
forming a bottom electrode composite layer on a top surface of the substrate, wherein the bottom electrode composite layer includes a first electrode layer on the top surface of the substrate and a second electrode layer on a top surface of the first electrode layer, and an oxidation rate of a material of the second electrode layer is lower than an oxidation rate of a material of the first electrode layer, the material of the first electrode layer including metal nitride with a first atomic ratio of metal atoms to nitrogen atoms, the material of the second electrode layer including metal nitride with a second atomic ratio of metal atoms to nitrogen atoms, the first atomic ratio of the metal nitride included in the first electrode layer being greater than the second atomic ratio of the metal nitride included in the second electrode layer;
forming a dielectric structure layer on a top surface of the second electrode layer, the dielectric structure layer including:
a first dielectric layer on the top surface of the second electrode layer;
a second dielectric layer on a top surface of the first dielectric layer, a material of the second dielectric layer being different from a material of the first dielectric layer; and
a third dielectric layer on a top surface of the second dielectric layer, a material of the third dielectric layer being same as the material of the first dielectric layer; and
forming a top electrode layer on a top surface of the third dielectric layer.

12. The method according to claim 11, wherein:
conductivity of the material of the first electrode layer is greater than conductivity of the material of the second electrode layer.

13. The method according to claim 11, wherein:
a process of forming the first electrode layer includes an ion reactive sputtering process, wherein a sputtering target includes a metal target, reactive gas includes mixed gas of argon and nitrogen, and a volume ratio of the argon to the nitrogen is not less than approximately 0.85; and
a process of forming the second electrode layer includes forming an initial second electrode layer on the first electrode layer, and planarizing the initial second electrode layer, thereby forming the second electrode layer.

14. The method according to claim 13, wherein:
a process of forming the initial second electrode layer includes an ion reactive sputtering process, wherein a sputtering target includes a metal target, reactive gas includes nitrogen, and cavity pressure is greater than approximately 160 mtorr; and
a process of planarizing the initial second electrode layer includes a chemical mechanical polishing process.

15. The method according to claim 11, wherein:
a process of forming the dielectric structure layer includes a chemical vapor deposition process, a low-pressure chemical vapor deposition process, an ion-enhanced chemical vapor deposition process, or an atomic layer deposition process.

16. The method according to claim 11, after forming the top electrode layer, further comprising:
etching the top electrode layer, the dielectric structure layer, and the bottom electrode composite layer until a surface of the isolation structure is exposed, thereby forming a bottom electrode composite structure, a dielectric structure on the bottom electrode composite structure, and a top electrode structure on the dielectric structure.

17. The method according to claim 11, after forming the dielectric structure layer, before forming the top electrode layer on the dielectric structure layer, further comprising:
annealing the dielectric structure layer and the bottom electrode composite layer, wherein:
annealing temperature is in a range approximately from 300 degrees Celsius to 450 degrees Celsius;
annealing time is in a range approximately from 60 seconds to 600 seconds; and
cavity gas includes inert gas or ammonia gas.

* * * * *